(12) United States Patent
Bodammer et al.

(10) Patent No.: US 12,176,851 B2
(45) Date of Patent: Dec. 24, 2024

(54) ENERGY-EFFICIENT COOLING OF A PEROVSKITE SOLAR CELL

(71) Applicant: Siemens Energy Global GmbH & Co. KG, Bayern (DE)

(72) Inventors: Georg Bodammer, Munich (DE); Wilhelm Kusian, Ebersberg (DE); Stephanie Leibl, Aschheim (DE); Roland Pohle, Herdweg (DE); Elfriede Simon, Munich (DE); Oliver von Sicard, Munich (DE); Maximilian Fleischer, Höhenkirchen (DE)

(73) Assignee: Siemens Energy Global GmbH & Co. KG, Bayern (DE)

( * ) Notice: Subject to any disclaimer, the term of this patent is extended or adjusted under 35 U.S.C. 154(b) by 86 days.

(21) Appl. No.: 17/784,542

(22) PCT Filed: Dec. 2, 2020

(86) PCT No.: PCT/EP2020/084191
§ 371 (c)(1),
(2) Date: Jun. 10, 2022

(87) PCT Pub. No.: WO2021/121987
PCT Pub. Date: Jun. 24, 2021

(65) Prior Publication Data
US 2023/0030635 A1    Feb. 2, 2023

(30) Foreign Application Priority Data

Dec. 20, 2019   (EP) .................................... 19218897

(51) Int. Cl.
*H02S 40/42* (2014.01)
*H01L 31/052* (2014.01)

(52) U.S. Cl.
CPC .......... *H02S 40/42* (2014.12); *H01L 31/0521* (2013.01)

(58) Field of Classification Search
CPC ... H01L 31/052; H01L 31/0521; H02S 40/42; H02S 40/425
See application file for complete search history.

(56) References Cited

U.S. PATENT DOCUMENTS

| | | | |
|---|---|---|---|
| 10,480,730 B1 | 11/2019 | Taylor | |
| 2013/0118551 A1* | 5/2013 | Sako | H01L 31/0521 |
| | | | 136/246 |
| 2015/0027511 A1* | 1/2015 | Jang | H02S 20/32 |
| | | | 136/246 |

FOREIGN PATENT DOCUMENTS

| | | | | |
|---|---|---|---|---|
| DE | 102007055462 A1 | 5/2009 | | |
| GB | 2321338 A | * | 7/1998 | ............. H01L 35/00 |
| KR | 101603782 B1 | * | 3/2016 | ............. H02S 40/42 |
| WO | WO-2017061361 A1 | * | 4/2017 | |
| WO | 2020064344 A1 | 4/2020 | | |

OTHER PUBLICATIONS

English machine translation of Uetani (WO 2017/061361) published Apr. 13, 2017.*
Katayama et al. ("Degradation and fault diagnosis of photovoltaic cells using impedance spectroscopy"); Solar Energy Materials and Solar Cells 194 (2019) 130-136.*
English machine translation of Janssen (DE 102007055432) published May 20, 2009.*
Ozemoya, A. & Swart, Arthur & Pienaar, H.C. & Schoeman, Ruaan. (2013). Factors impacting on the surface temperature of a PV panel.*
English machine translation of Yun et al. (KR 101603782) published Mar. 28, 2016.*
Ludmila Cojocaru, et al.; Temperature_Effects on the Photovoltaic Performance of Planar Structure Perovskite Solar Cells; Segawahttps://www.researchgate.net/publication/282511262_Temperature_Effects_on_the_Photovoltaic_Performance_of_Planar_Structure_Perovskite_Solar_Cells; https://onlinelibrary.wiley.com/doi/abs/10.1002/cssc.201802899;; 2015.
So-Min Yoo et al; "From Dye Sensitized to Perovskite Solar Cells, The Missing Link"; arxiv.org, Cornell University Library, 201 Olin Library Cornell University Ithaca, NY 14853; XP081371419; the whole document; 2019.
Arif D. Sheikh, et al. Effects of High Temperature and Thermal Cycling on the Performance of Perovskite Solar Cells: Acceleration of Charge Recombination and Deterioration of Charge Extraction; ACS Appl. Mater. Interfaces 2017, 9, 40, 35018-35029 Publication Date:Sep. 18, 2017; https://doi.org/10.1021/acsami.7b11250; 2017.
Best Research-Cell Efficiency Chart; https://www.nrel.gov/pv/cell-efficiency.html.
PCT International Search Report and Written Opinion of International Searching Authority mailed Feb. 1, 2021 corresponding to PCT International Application No. PCT/EP2020/084191 filed Dec. 2, 2020.

* cited by examiner

*Primary Examiner* — Christina Chern
(74) *Attorney, Agent, or Firm* — Wolter Van Dyke Davis, PLLC

(57) ABSTRACT

A method for control of a cooling device for the active cooling of a perovskite solar cell, wherein the perovskite solar cell is part of a perovskite photovoltaic module. The method includes determining a measure of the internal temperature of the perovskite solar cell and activating the cooling device when the determined measure of the internal temperature of the perovskite solar cell is greater than a corresponding measure of a predetermined temperature threshold value. A photovoltaic apparatus having a perovskite photovoltaic module includes at least one perovskite solar cell, and a cooling device for the active cooling of the perovskite solar cell.

11 Claims, No Drawings

ENERGY-EFFICIENT COOLING OF A PEROVSKITE SOLAR CELL

CROSS REFERENCE TO RELATED APPLICATIONS

This application is the US National Stage of International Application No. PCT/EP2020/084191 filed 2 Dec. 2020, and claims the benefit thereof. The International Application claims the benefit of European Application No. EP19218897 filed 20 Dec. 2019. All of the applications are incorporated by reference herein in their entirety.

FIELD OF INVENTION

The invention relates to a method for controlling a cooling device for the active cooling of a perovskite solar cell. Furthermore, the invention relates to a photovoltaic apparatus comprising a perovskite photovoltaic module having at least one perovskite solar cell, and comprising a cooling device for the active cooling of the perovskite solar cell.

BACKGROUND OF INVENTION

It is known that the efficiency of perovskite solar cells typically decreases at high temperatures. This decrease or this impairment of the efficiency at high temperatures is generally not just more highly pronounced than in the case of conventional crystalline silicon solar cells, but is also irreversible under certain circumstances. The temperature starting from which there is a risk of the perovskite solar cell being permanently damaged is also referred to as the critical temperature. It is thus important for the temperature of the perovskite solar cell always to remain below this critical temperature even in the case of e.g. high solar irradiation.

The critical temperature is greatly dependent on the structure, material composition and processing of the perovskite solar cell. Under certain circumstances, the critical temperature of a perovskite solar cell may be at values as low as 50° C. or 60° C.—a temperature that the solar cell can usually reach rapidly during operation.

A first approach for tackling the challenge of the perovskite solar cells becoming degraded at temperatures above the critical temperature is modification of the structure, material composition and/or processing of the perovskite solar cell. The modification is effected with the objective of increasing the level (in other words the magnitude) of the critical temperature of the perovskite solar cell.

A second approach consists in finding ways and means of at least partly "healing" the impairment of the efficiency on account of high temperatures to which the perovskite solar cell is exposed. In other words, this approach pursues the aim of actually at least partly reversing the supposedly irreversible damage to the perovskite material.

Totally satisfactory and practicable solutions have not been obtained hitherto, either with the first approach or with the second approach.

SUMMARY OF INVENTION

The object of the present invention is to develop an alternative concept for reducing the risk of permanent damage to the perovskite solar cell on account of thermal effects.

This object is achieved by the method for controlling a cooling device and also the photovoltaic apparatus as claimed in the independent claims. Advantageous developments and embodiments are disclosed in the dependent claims, the description and the drawings.

DETAILED DESCRIPTION OF INVENTION

The method according to the invention relates to the control of a cooling device for the active cooling of a perovskite solar cell, wherein the perovskite solar cell is part of a perovskite photovoltaic module. The method comprises the following steps:—determining a measure of the internal temperature of the perovskite solar cell and—activating the cooling device if the determined measure of the internal temperature of the perovskite solar cell is greater than a corresponding measure of a predetermined temperature threshold value.

The perovskite solar cell is thus cooled as necessary, namely in the event of a certain threshold value of the temperature being exceeded, which threshold value is advantageously less than the critical temperature of the perovskite solar cell. This is intended to prevent the perovskite solar cell from being exposed to higher temperatures than its critical temperature. Damage to the solar cell that is irreversible under certain circumstances can thus be avoided from the outset.

The control of the cooling is based on the internal temperature of the perovskite solar cell or a corresponding measure of the internal temperature. The measure of the internal temperature of the perovskite solar cell is determined in particular continuously or at intervals. If this measure exceeds a predetermined threshold value, the cooling device is activated. If the measure of the internal temperature falls below the threshold value again, the cooling device is deactivated. This enables energy-saving and thus efficient cooling of the perovskite solar cell(s) in line with requirements.

One important aspect of the present invention is that the cooling device is activated depending on the internal temperature of the perovskite solar cell. The internal temperature—also referred to in the jargon in English as "bulk temperature"—should be understood here as distinct from the surface temperature. The internal temperature of the solar cell relates in particular to the temperature of the light-absorbing layer of the solar cell. In the case of a perovskite solar cell having a p-i-n construction, i.e. having a hole-conducting layer, an intrinsic layer and an electron-conducting layer, the light-absorbing layer comprises the intrinsic layer, in particular. In the case of a perovskite solar cell, the intrinsic layer has e.g. the (crystal) structure $CH_3NH_3PbI_3$. Since, in the case of a perovskite solar cell, primarily the intrinsic, perovskite-based layer can degrade irreversibly if it is exposed to temperatures above the critical temperature, primarily the temperature of this region of the solar cell, i.e. the internal temperature thereof, is important. On the other hand, if for example the temperature at the front-side contacts of the perovskite solar cell is above the critical temperature, but the actual temperature of the light-absorbing layer is below the critical temperature, the perovskite solar cell is still "alright" and an activation of cooling of the solar cell need not yet be initiated.

A further important aspect of the invention is that the perovskite solar cell is actively cooled in accordance with the method according to the invention. This should be seen in particular as distinct from permanent cooling. Since the internal temperature of the perovskite solar cell or a corresponding measure thereof is used as a controlled variable for the cooling device, this ensures that the cooling proceeds only when there is actually a need for cooling. The method according to the invention is thus energy-saving and hence conserves money and resources.

Active cooling primarily has the advantage that it is energy-saving since cooling is effected only when it is necessary. The active cooling advantageously has a relatively high cooling capacity in order that, with the highest possible probability, the internal temperature is actually reliably prevented from exceeding the critical temperature of the solar cell. The method according to the invention thus constitutes a reliable and energy-efficient cooling mechanism for a perovskite solar cell that reduces the risk of permanent damage to the perovskite solar cell on account of thermal effects.

Active cooling should also be seen as distinct from so-called rear ventilation. The rear ventilation of a photovoltaic module is known from photovoltaic modules comprising conventional crystalline silicon solar cells. For this purpose, the photovoltaic modules are mounted at a certain distance from the roof. In order to achieve sufficient rear activation of the photovoltaic modules, it is recommendable to maintain a distance between roof and module of approximately 10 cm. The rear ventilation of the modules functions using convection air. A chimney effect arises in the space between photovoltaic module and roof panel, the intensity of the effect (and thus of the cooling) being dependent both on the magnitude of the distance between roof and module and on the material of the roof panel and the underside of the modules. There are height-adjustable roof hooks in order that a desired distance can be maintained more easily.

It goes without saying that the perovskite photovoltaic module generally has more than one perovskite solar cell, specifically a multiplicity of perovskite solar cells. A perovskite solar cell can also be part of a tandem cell constructed from a perovskite solar cell and a further solar cell, for example a conventional silicon solar cell. On a laboratory scale, an impressive efficiency of 28% has recently been achieved for such tandem solar cells.

The first method step includes determining a measure of the internal temperature of the perovskite solar cell. If the perovskite photovoltaic module has a plurality of perovskite solar cells, the first method step can also include determining the measures of the internal temperatures of a plurality of perovskite solar cells of the perovskite photovoltaic module.

The measure of the internal temperature is understood to mean that parameter which is suitable for characterizing the internal temperature of the perovskite solar cell. This can be very directly the actual temperature using the unit Kelvins (or degrees Celsius or Fahrenheit). However, this can also be a current intensity in amperes or a voltage in volts, for example, which are not converted into a concrete temperature at all, but can nevertheless be used to assess whether the instantaneous internal temperature of the perovskite solar cell is above or below a predetermined temperature threshold value.

The predetermined temperature threshold value is advantageously chosen such that it is somewhat below the critical temperature. Depending on the configuration of the cooling device, in particular with regard to the cooling capacity, the temperature threshold value should be chosen so as to ensure that after the temperature threshold value has been exceeded and the cooling device has been activated, as a rule the temperature continues to rise only by such an amount that it still remains below the critical temperature of the perovskite solar cell.

A "predetermined" temperature threshold value is understood to mean a predefined temperature threshold value. Bearing in mind that the critical temperature of a perovskite solar cell signifying imminent irreversible degradation of its efficiency is greatly dependent on the concrete cell type, the corresponding temperature threshold value should be individually defined.

Various methods are conceivable in regard to how the internal temperature or a measure thereof can be concretely determined.

A first method is based on impedance spectroscopy, in particular electrochemical impedance spectroscopy. For this purpose, an AC voltage is applied to the perovskite solar cell and the resulting current flow is measured for various frequencies of the AC voltage. On the basis of a suitable plot of the measurement results, for example in a so-called Bode or Nyquist diagram, conclusions can subsequently be drawn about internal parameters of the perovskite solar cell, e.g. charge carrier transport or recombination rate of the charge carriers. In particular, the internal temperature of the perovskite solar cell can also be determined by means of impedance spectroscopy, as described for example in the international patent application PCT/EP2019/074317, filed on Sep. 12, 2019.

A second method for determining the internal temperature of the perovskite solar cell includes the use of a thermocouple. A thermocouple consists of a pair of metallic conductors composed of different materials, which are connected at one end and are suitable for temperature measurement on account of the thermoelectric effect. In principle, the thermocouple supplies electrical energy from heat in the event of a temperature difference along the electrical conductor. The electrical voltage that occurs in this case at the ends of the metallic conductors is comparatively small and varies in the range of a few 10 µV per 1° C. temperature difference. The two metallic conductors of the thermocouple are advantageously directly connected to the light-absorbing layer of the perovskite solar cell, that is to say e.g. to the intrinsic layer thereof. Such a connection is generally established permanently, such that the internal temperature of the solar cell can be monitored continuously during operation of the perovskite photovoltaic module.

Various realizations are also conceivable for the concrete configuration of the cooling device for the active cooling of the perovskite solar cell.

By way of example, the cooling of the solar cells by means of a cooling liquid is possible. The cooling liquid can be guided e.g. in pipes or tubes in the vicinity of the solar cells. In this case, the cooling device would expediently have an inlet and outlet, the temperature of the cooling liquid at the inlet being lower than the predetermined temperature threshold value at which the cooling is activated. The cooling liquid can substantially consist of water with optionally added additives for lowering the freezing point and/or for increasing the boiling point.

Liquid-based cooling of the perovskite solar cells is also possible by means of rainwater, for example, which is collected and guided in a controlled manner over an inclined surface of the perovskite photovoltaic module. In this case, in the event of the predetermined temperature threshold value being exceeded, rainwater is guided over the surface of the module, the temperature of the water being lower than the temperature of the photovoltaic module and cooling of the module and of the perovskite solar cells contained therein thus being brought about. The control of the cooling is based on the internal temperature of the perovskite solar cell or a corresponding measure of the internal temperature. The measure of the internal temperature of the perovskite solar cell is thus determined continuously or at intervals. If this measure exceeds a predetermined threshold value, the cooling device is activated—in the case of cooling by means of a reservoir of rainwater, for example, by the opening of a valve at the outflow of the reservoir. The use of rainwater is advantageous from the standpoint that possible calcareous residues on the surface of the module can thus be avoided. In principle, however, alternative cooling liquids are also conceivable, of course. Furthermore, the use of rainwater in an open system is also conceivable, in which the rainwater can evaporate and the heat of evaporation—also referred to as "evaporative cooling"—is used to cool the perovskite solar cell(s) of the photovoltaic module.

In another embodiment of the invention, the cooling device has a radiator for emitting heat by thermal radiation. The radiator consists of a metal having good thermal conductivity, for example, and has a surface with a high emissivity.

The radiator—but also other configurations of the cooling device—are arranged in particular on the side of the perovskite photovoltaic module facing away from the sun. This has the advantage, firstly, that they do not cause any shading of the solar cells at all. Secondly, heating of the cooling device is minimized as a result.

In a further embodiment of the invention, the cooling device has a Peltier element. Upon activation of the cooling device, a current flow through the Peltier element produces a reduction of the internal temperature of the perovskite solar cell.

A Peltier element is understood here to mean an electrothermal transducer which produces a temperature difference in the event of current throughflow on the basis of the Peltier effect. Peltier elements can thus be used for cooling an object that is thermally conductively connected to the Peltier element. In this use Peltier elements are also referred to as a Peltier cooler or TEC (thermoelectric cooler).

In a further embodiment of the invention, the cooling device has a multiplicity of channels in a covering plate of the perovskite photovoltaic module. The covering plate is realized for example as a pane of glass, in particular as single-pane safety glass. The channels have a small size in comparison with the other dimensions of the photovoltaic module and are also referred to in the jargon as microchannels. Upon activation of the cooling device, a cooling liquid flows through the channels. Once again, at least in regard to the feed flow, the cooling liquid is at a lower temperature than the component to be cooled, here the perovskite solar cell. Consequently, the cooling liquid absorbs part of the thermal energy of the perovskite solar cell and thus provides for cooling of the internal temperature of the perovskite solar cell.

If the cooling device is arranged on the exterior of the perovskite photovoltaic module, for example, there is advantageously good thermal conduction from the cooling medium to the perovskite solar cell to be cooled.

In addition to the described method according to the invention for controlling the cooling device, the invention also relates to a photovoltaic apparatus comprising a perovskite photovoltaic module and a cooling device. The perovskite photovoltaic module has one or a plurality of perovskite solar cells. The cooling device is suitable for the active cooling of the perovskite solar cell. The photovoltaic apparatus furthermore has a control device for controlling the cooling device. The control device is configured in particular to carry out a method in accordance with any of the embodiments described above.

The active cooling of the perovskite photovoltaic module can optionally also be combined with a passive cooling mechanism of the module or with a passive temperature stabilization mechanism of the perovskite photovoltaic module. Known passive temperature stabilization mechanisms in this context are the provision of a large thermal mass in the form of e.g. a water tank on the rear side of the photovoltaic module or the use of a latent heat storage unit that stores a large portion of the thermal energy fed to it in the form of latent heat (e.g. for a phase change from solid to liquid).

The invention claimed is:

1. A method for controlling a cooling device for active cooling of a perovskite solar cell, wherein the perovskite solar cell is part of a perovskite photovoltaic module, the method comprising:
   determining a measure of an internal temperature of the perovskite solar cell, wherein the perovskite solar cell comprises a light-absorbing layer and the measure of the internal temperature is a temperature of the light-absorbing layer,
   not activating the cooling device when the determined measure of the internal temperature of the light-absorbing layer of the perovskite solar cell is less than a predetermined temperature threshold value while a temperature of front side contacts of the perovskite solar cell is greater than the predetermined temperature threshold value, and
   activating the cooling device when the determined measure of the internal temperature of the perovskite solar cell is greater than the predetermined temperature threshold value.

2. The method as claimed in claim 1,
   wherein the measure of the internal temperature of the perovskite solar cell is determined by impedance spectroscopy.

3. The method as claimed in claim 1,
   wherein the measure of the internal temperature of the perovskite solar cell is determined by a thermocouple.

4. The method as claimed in claim 1,
   wherein the cooling device is situated substantially on a side of the perovskite photovoltaic module facing away from the sun.

5. The method as claimed in claim 1,
   wherein the cooling device comprises a Peltier element and, upon activation of the cooling device, a current flow through the Peltier element produces a reduction of the internal temperature of the perovskite solar cell.

6. The method as claimed in claim 1,
   wherein the cooling device comprises a cooling liquid, which is at a lower temperature than the temperature threshold value at least upon activation of the cooling device, at an inlet of the cooling device.

7. The method as claimed in claim 1,
   wherein the cooling device has a radiator for emitting heat by thermal radiation.

8. The method as claimed in claim 1,
   wherein the cooling device has a multiplicity of channels in a covering plate of the perovskite photovoltaic module.

9. The method as claimed in claim 8,
   wherein, upon activation of the cooling device, a cooling liquid flows through the channels and absorbs part of a thermal energy of the perovskite solar cell.

10. The method as claimed in claim 1,
    wherein the perovskite photovoltaic module has a frame and the perovskite solar cell is thermally conductively connected to the frame.

11. A photovoltaic apparatus, comprising:
    a perovskite photovoltaic module, wherein the perovskite photovoltaic module has at least one perovskite solar cell comprising a light-absorbing layer, and a cooling device for active cooling of the at least one perovskite solar cell, and a control device for controlling the cooling device in response to an internal temperature of the at least one perovskite solar cell, wherein the controlling is based on the following:

not activating the cooling device when a determined measure of the internal temperature of the light-absorbing layer of the at least one perovskite solar cell is less than a predetermined temperature threshold value while a temperature of front side contacts of the at least one perovskite solar cell is greater than the predetermined temperature threshold value, and activating the cooling device when the determined measure of the internal temperature of the light-absorbing layer of the at least one perovskite solar cell is greater than the predetermined temperature threshold value.

* * * * *